United States Patent
Chen et al.

(10) Patent No.: US 11,823,870 B2
(45) Date of Patent: Nov. 21, 2023

(54) PEALD TITANIUM NITRIDE WITH DIRECT MICROWAVE PLASMA

(71) Applicant: Applied Materials, Inc., Santa Clara, CA (US)

(72) Inventors: Hanhong Chen, Milpitas, CA (US); Arkaprava Dan, San Jose, CA (US); Joseph AuBuchon, San Jose, CA (US); Kyoung Ha Kim, Cupertino, CA (US); Philip A. Kraus, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 480 days.

(21) Appl. No.: 16/990,306

(22) Filed: Aug. 11, 2020

(65) Prior Publication Data
US 2021/0050186 A1 Feb. 18, 2021

Related U.S. Application Data
(60) Provisional application No. 62/886,334, filed on Aug. 13, 2019.

(51) Int. Cl.
*H01L 21/285* (2006.01)
*H01J 37/32* (2006.01)
(Continued)

(52) U.S. Cl.
CPC ........ *H01J 37/32201* (2013.01); *C23C 16/34* (2013.01); *C23C 16/511* (2013.01);
(Continued)

(58) Field of Classification Search
CPC ........... H01L 21/02274; H01L 21/0228; H01L 21/28568; H01L 21/76841;
(Continued)

(56) References Cited

U.S. PATENT DOCUMENTS

| 4,715,937 | A | 12/1987 | Moslehi et al. |
| 6,338,880 | B1 * | 1/2002 | Akram ................... C23C 16/34 438/681 |

(Continued)

FOREIGN PATENT DOCUMENTS

| EP | 3186815 B1 | 6/2019 |
| KR | 20150041755 A | 4/2015 |

(Continued)

OTHER PUBLICATIONS

Korzec et al., Remote and direct microwave plasma deposition of HMDSO films: comparative study, Surface and Coatings Technology pp. 67-74. (Year: 1995).*

(Continued)

*Primary Examiner* — Brook Kebede
(74) *Attorney, Agent, or Firm* — Servilla Whitney LLC

(57) ABSTRACT

A method of depositing titanium nitride is disclosed. Some embodiments of the disclosure provide a PEALD process for depositing titanium nitride which utilizes a direct microwave plasma. In some embodiments, the direct microwave plasma has a high plasma density and low ion energy. In some embodiments, the plasma is generated directly above the substrate surface.

17 Claims, 3 Drawing Sheets

(51) Int. Cl.
*C23C 16/34* (2006.01)
*H01L 21/768* (2006.01)
*C23C 16/511* (2006.01)

(52) U.S. Cl.
CPC .. *H01L 21/28568* (2013.01); *H01L 21/76841* (2013.01); *H01J 2237/3321* (2013.01)

(58) Field of Classification Search
CPC ........ H01J 37/32201; H01J 2237/3321; C23C 16/34; C23C 16/511
See application file for complete search history.

(56) References Cited

U.S. PATENT DOCUMENTS

| | | | |
|---|---|---|---|
| 7,485,349 B2 | 2/2009 | Koh et al. | |
| 7,727,864 B2 | 6/2010 | Elers | |
| 9,036,956 B2 | 5/2015 | Tseng et al. | |
| 2002/0155219 A1 | 10/2002 | Wang et al. | |
| 2003/0200917 A1 | 10/2003 | Vaarstra | |
| 2004/0089233 A1 | 5/2004 | Carpenter et al. | |
| 2012/0153122 A1 | 6/2012 | Denatale et al. | |
| 2014/0030889 A1* | 1/2014 | Chem | H01L 21/76861 257/E21584 |
| 2014/0370708 A1* | 12/2014 | Wu | H01L 21/0273 438/712 |
| 2015/0179509 A1* | 6/2015 | Limdulpaiboon | H01L 21/76843 438/785 |
| 2018/0037992 A1* | 2/2018 | Fukiage | H01L 21/02211 |
| 2018/0053634 A1* | 2/2018 | Kraus | H01J 37/32247 |
| 2018/0294143 A1 | 10/2018 | Chua et al. | |
| 2018/0323043 A1* | 11/2018 | Kraus | H01J 37/32238 |
| 2019/0326098 A1* | 10/2019 | Nguyen | H01J 37/32201 |
| 2019/0333858 A1 | 10/2019 | Kim et al. | |
| 2020/0161308 A1 | 5/2020 | Kim et al. | |

FOREIGN PATENT DOCUMENTS

| | | |
|---|---|---|
| WO | 2016031076 A1 | 3/2016 |
| WO | 2017134698 A1 | 8/2017 |

OTHER PUBLICATIONS

Chen, Z.X., "Plasma-Enhanced Atomic Layer Deposition (PEALD) of TiN using the Organic Precursor Tetrakis (ethylmethylamido)Titanium (TEMAT)", MATEC Web of Conferences 39, 01010 (2016).

Kim, Ju Youn, et al., "Characterisitics and Compositional Variation TiN Films Deposited by Remote PEALD on Contact Holes (abstract only)", Journal of The Elecochemical Society, vol. 152, No. 1, Published Nov. 17, 2004.

Kim, Ju Youn, "Characterisitics of TiN Films Deposited by Remote Plasma-Enhanced Atomic Layer Deposition Method (abstract only)", Japanese Journal of Applied Physics, vol. 4, Part 2, No. 4D, Published Apr. 1, 2003.

Musschoot, J., et al., "Atomic Layer deposition of titanium nitride from TDMAT precursor (Abstract only)", Microelectronic Engineering, vol. 86, Issued 1, Jan. 2009, pp. 72-77.

PCT International Search Report and Written Opinion in PCT/US2020/045741 dated Nov. 19, 2020, 10 pages.

* cited by examiner

PEALD TITANIUM NITRIDE WITH DIRECT MICROWAVE PLASMA

CROSS-REFERENCE TO RELATED APPLICATIONS

This application claims priority to U.S. Provisional Application No. 62/886,334, filed Aug. 13, 2019, the entire disclosure of which is hereby incorporated by reference herein.

TECHNICAL FIELD

Embodiments of the present disclosure generally relate to methods for forming titanium nitride. Some embodiments of the disclosure utilize atomic layer deposition methods. Some embodiments of the disclosure utilize a direct microwave plasma.

BACKGROUND

Titanium nitride (TiN) is an essential material in the manufacturing of semiconductors. Titanium nitride often serves as a conductive connection between the active device and the metal contacts used to operate the circuit, while acting as a diffusion barrier to block the diffusion of the metal from the metal contacts.

Recent chip designs in 45 nm technology and beyond make use of TiN as a conductor for improved transistor performance. In combination with gate dielectrics (e.g. HfSiO) that have a higher permittivity compared to standard $SiO_2$, the gate length can be scaled down with low leakage, higher drive current and the same or better threshold voltage.

Titanium nitride can be deposited by a thermal reaction using a titanium halide precursor, such as $TiCl_4$, or a Ti metal organic precursor, such as TDMAT, and a nitrogen source, such as ammonia. Thermal ALD of titanium nitride typically provides films higher impurities and higher resistivity. Further, these processes must be performed at relatively high wafer temperatures.

Plasma-Enhanced ALD (PEALD) of titanium nitride has also been demonstrated using capacitor coupled RF plasma (CCP) and remote plasmas (RPS). CCP is limited by the fact that the relatively high ion energy may cause plasma damage to the substrate. Further, the ion flux cannot reach high aspect ratio structures such as trenches, and holes, often producing films with lower conformality. RPS has the advantage of being an ion free and purely radical based process; however, RPS plasma suffers from a low concentration of radicals due to the larger distance from the plasma generation to the substrate.

Accordingly, there is a need for methods of depositing titanium nitride which utilize a plasma process.

SUMMARY

One or more embodiments of the disclosure are directed to a method of depositing titanium nitride. The method comprises the sequential exposure of a substrate surface within a processing volume to a titanium precursor and a direct microwave plasma generated from a plasma gas.

Additional embodiments of the disclosure are directed to a method of depositing titanium nitride. The method comprises the sequential exposure of a substrate surface within a processing volume to a titanium precursor, ammonia gas, and a direct microwave plasma generated from a plasma gas.

Further embodiments of the disclosure are directed to a method of depositing titanium nitride. The method comprises the sequential exposure of a substrate surface within a processing volume to a titanium precursor, a first pulse of ammonia gas, a direct microwave plasma generated from a plasma gas, and a second pulse of ammonia gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
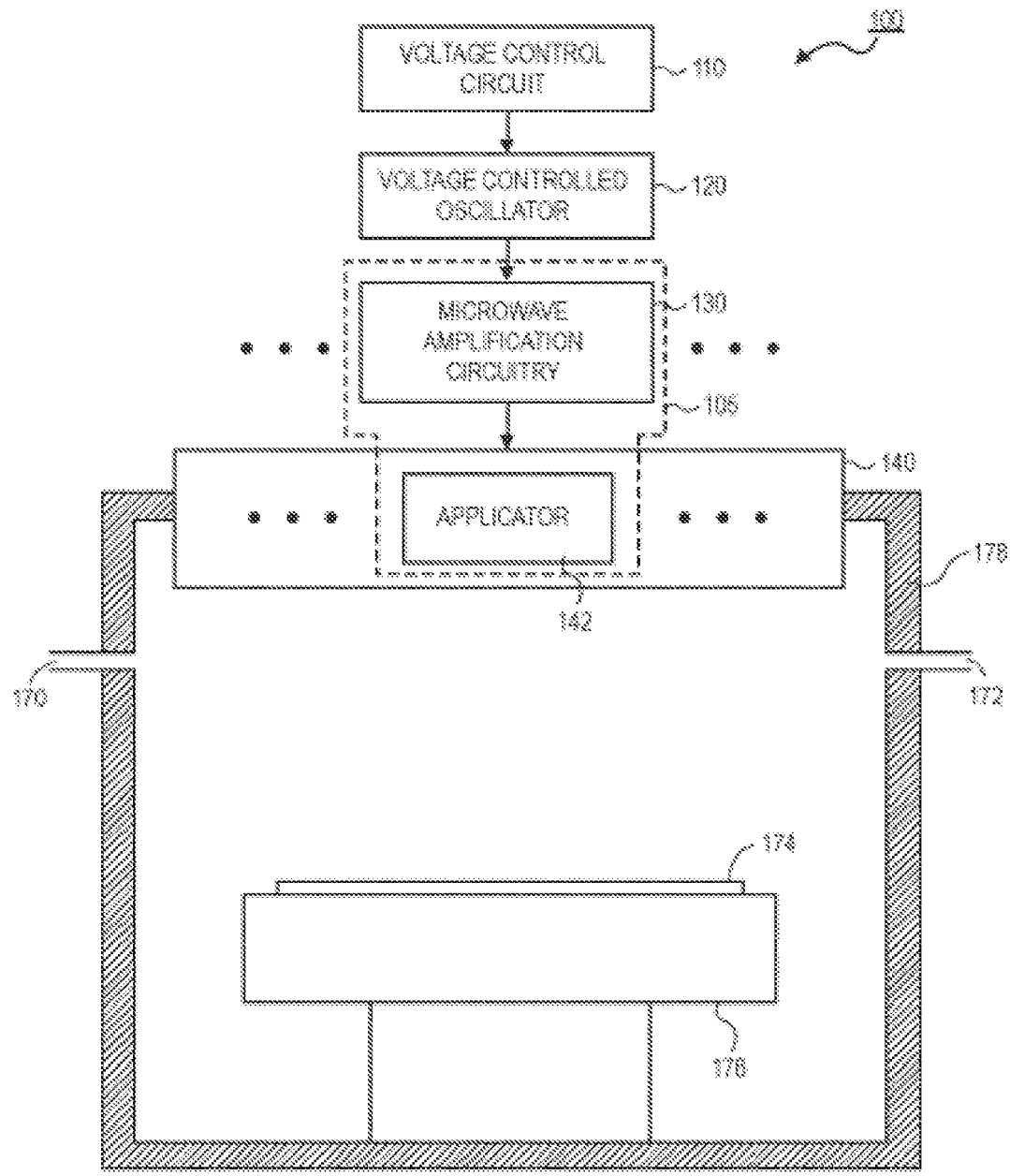
FIG. 1 illustrates a schematic diagram of a plasma processing tool that includes a microwave plasma source according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods for depositing titanium nitride using direct microwave plasma enhanced atomic layer deposition (PEALD) process. Some embodiments of the disclosure advantageously provide superior TiN films to those provided by thermal TiN deposition processes. Some embodiments of the disclosure advantageously provide films with a modified Ti:N ratio, lower Cl⁻ concentration, lower resistivity or lower film stress.

In contrast to CCP and RPS plasmas, direct microwave (uwave) plasma advantageously provides higher plasma radical density than RPS and lower ion energy than CCP. Accordingly, microwave plasma can provide a relatively high radical concentration for ALD process, without causing ion damage to the substrate. Further, PEALD with microwave plasma has demonstrated the ability to tune film composition, resistivity and stress.

As used in the disclosure and the appended claims, "titanium nitride" or "TiN" refers to an inorganic material consisting essentially of titanium and nitrogen atoms. Unless indicated otherwise, no specific ratio of titanium and nitrogen, stoichiometric or otherwise, should be inferred from the disclosure.

Referring to FIG. 1, a cross-sectional illustration of an exemplary processing tool 100 is shown. The processing tool 100 may be a processing tool suitable for any type of processing operation that utilizes a plasma. While the embodiments described in detail herein are directed to ALD plasma processing methods, it is to be appreciated that additional plasma processing methods may also be practiced on processing tool 100. Further, it is also to be appreciated that the PEALD methods described herein may also be performed using differing processing tools.

Generally, the processing tool 100 includes a chamber 178. In processing tools 100 that are used for plasma processing, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool may include a showerhead or other gas distribution assembly for evenly distributing the processing gases over a substrate 174.

In some embodiments, the substrate 174 may be supported on a chuck 176. For example, the chuck 176 may be any suitable chuck, such as an electrostatic chuck. The chuck may also include cooling lines and/or a heater to provide temperature control to the substrate 174 during processing.

The processing tool 100 includes one or more microwave sources 105. The microwave source 105 may include solid state microwave amplification circuitry 130 and an applicator 142. In some embodiments, a voltage control circuit 110 provides an input voltage to a voltage controlled oscillator 120 in order to produce microwave radiation at a desired frequency that is transmitted to the solid state microwave amplification circuitry 130 in each microwave source 105. After processing by the microwave amplification circuitry 130, the microwave radiation is transmitted to the applicator 142. In some embodiments, an array 140 of applicators 142 are coupled to the chamber 178 and each function as an antenna for coupling the microwave radiation to the processing gasses in the chamber 178 to produce a plasma.

Figure 2:
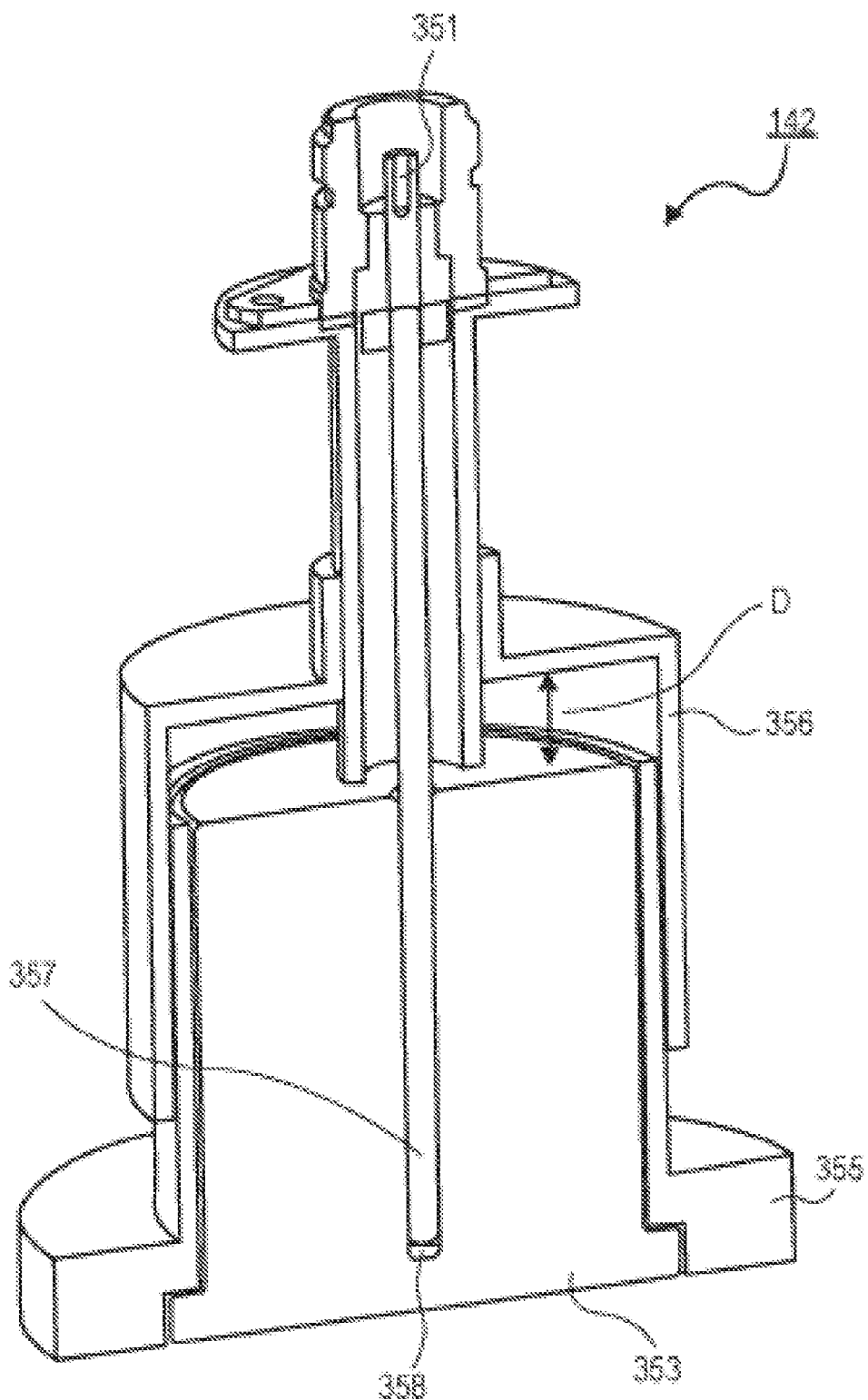
FIG. 2 illustrates a cross-sectional view of an applicator that may be used to couple microwave radiation to a processing chamber according to one or more embodiment of the disclosure.

Referring now to FIG. 2, a cross-sectional illustration of an applicator 142 is shown, according to one or more embodiment. In some embodiments, the microwave radiation is transmitted to an applicator 142 by a coaxial cable 351 that couples to a monopole 357 that extends axially through the applicator 142. The monopole 357 may also extend into a channel 358 formed into a center of a dielectric resonant cavity 353. The dielectric resonant cavity 353 may be a dielectric material, such as quartz, aluminum oxide, titanium oxide, or the like. Some embodiments may also include a resonant cavity 353 that does not include a material (i.e., the dielectric resonant cavity 353 may be air or a vacuum).

In some embodiments, the dielectric resonator is dimensioned so that the dielectric resonator supports resonance of the microwave radiation. Generally, the size of the dielectric resonant cavity 353 is dependent on the dielectric constant of the material used to form the dielectric resonant cavity 353 and the frequency of the microwave radiation. For example, materials with higher dielectric constants would allow for smaller resonant cavities 353 to be formed. In an embodiment where the dielectric resonant cavity 353 includes a circular cross-section, the diameter of the dielectric resonant cavity 353 may be between approximately 1 cm and 15 cm.

In some embodiments, the cross-section of the dielectric resonant cavity 353 along a plane perpendicular to the monopole 357 may be any shape, so long as the dielectric resonant cavity 353 is dimensioned to support resonance. In the illustrated embodiment shown in FIG. 2, the cross-section along a plane perpendicular to the monopole 357 is circular, though other shapes may also be used, such as polygons (e.g., triangles, rectangles, etc.), symmetrical polygons (e.g., squares, pentagons, hexagons, etc.), ellipses, or the like.

In some embodiments, the cross-section of the dielectric resonant cavity 353 may not be the same at all planes perpendicular to the monopole 357. For example, the cross-section of a bottom extension proximate to the open end of the applicator housing 355 may be wider than the cross-section of the dielectric resonant cavity proximate to the channel 358. In addition to having cross-sections of different dimensions, the dielectric resonant cavity 353 may have cross-sections with different shapes. For example, the portion of the dielectric resonant cavity 353 proximate to the channel 358 may have a circular shaped cross-section, whereas the portion of the dielectric resonant cavity 353 proximate to the open end of the applicator housing 355 may be a symmetrical polygon shape (e.g., pentagon, hexagon, etc.). However, it is to be understood that embodiments may also include a dielectric resonant cavity 353 that has a uniform cross-section at all planes perpendicular to the monopole 357.

In some embodiments, the applicator 142 may also include an impedance tuning backshort 356. The backshort 356 may be a displaceable enclosure that slides over an outer surface of the applicator housing 355. When adjustments to the impedance need to be made, an actuator (not shown) may slide the backshort 356 along the outer surface of the applicator housing 355 to change a distance D between a surface of the backshort 356 and a top surface of the dielectric resonant cavity 353. As such, some embodiments provide more than one way to adjust the impedance in the system. In some embodiments, an impedance tuning backshort 356 may be used in conjunction with a feedback process to account for impedance mismatches. Alternatively, the feedback process or an impedance tuning backshort 356 may be used by themselves to adjust for impedance mismatches.

In some embodiments, the applicator 142 functions as a dielectric antenna that directly couples the microwave electromagnetic field into the processing chamber 178. The particular axial arrangement of the monopole 357 entering the dielectric resonant cavity 353 may produce an TM01δ mode excitation. However different modes of excitation may be possible with different applicator arrangements. For example, while an axial arrangement is illustrated in FIG. 2, it is to be appreciated that the monopole 357 may enter the dielectric resonant cavity 353 from other orientations. In one such embodiment, the monopole 357 may enter the dielectric resonant cavity 353 laterally, (i.e., through a sidewall of the dielectric resonant cavity 353).

Figure 3:
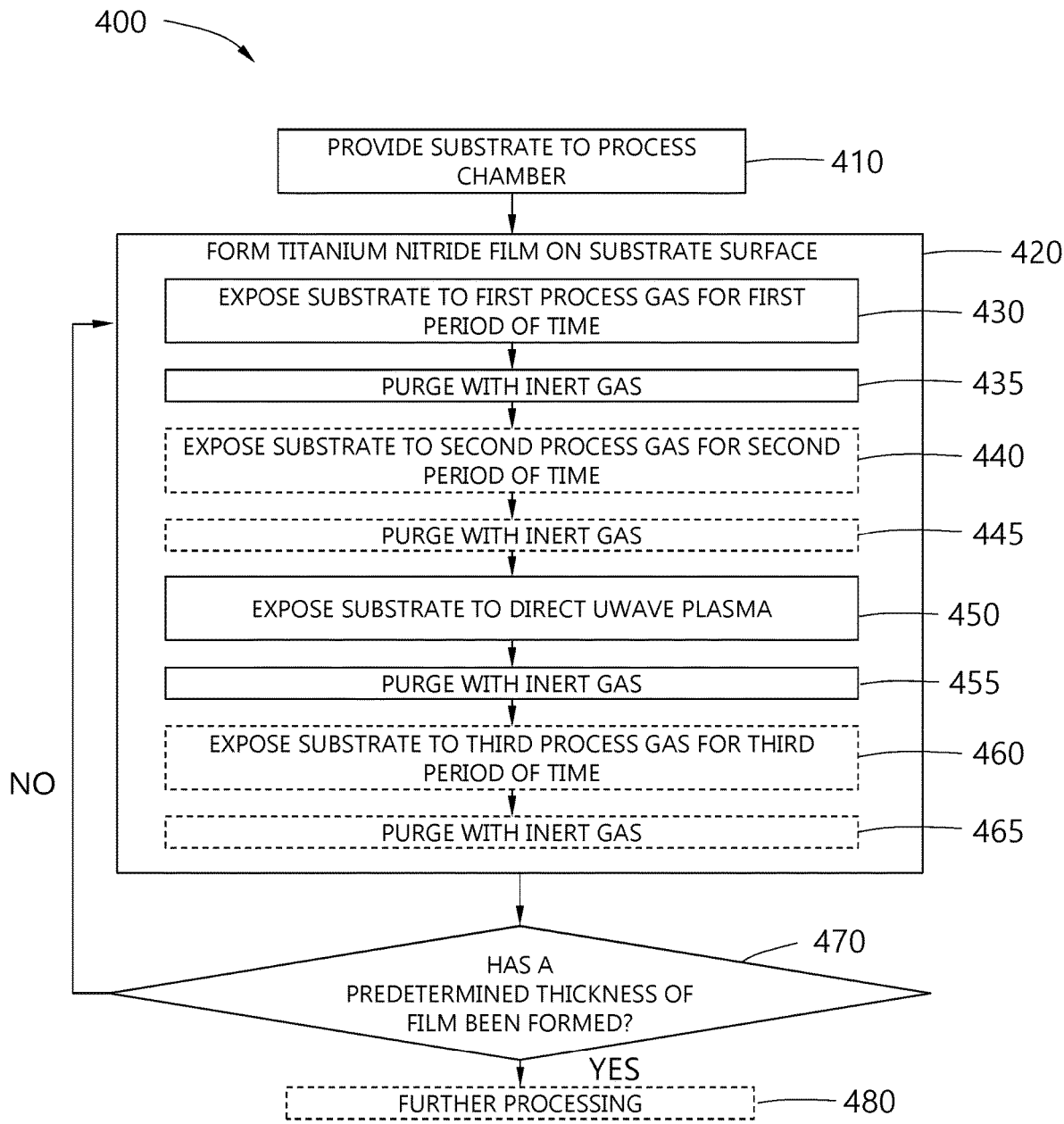
FIG. 3 illustrates an exemplary process sequence for the formation of titanium nitride according to one or more embodiment of the disclosure.

FIG. 3 depicts a generalized method 400 for forming a titanium nitride film on a substrate in accordance with one or more embodiment of the disclosure. The method 400 generally begins at 410, where a substrate upon which a titanium nitride film is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the titanium nitride film, for example, by polishing, etching, reduction, oxidation, halogenation, hydroxylation, annealing, baking, or the like.

At 420, a titanium nitride film is formed on the substrate surface. The titanium nitride film may be formed via a cyclical deposition process, such as atomic layer deposition (ALD), or the like.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first reactive gas may be provided to the process chamber followed by a purge with an inert gas. Next, a second reactive gas may be provided to the process chamber followed by a purge with an inert gas. In some embodiments, the inert gas may be continuously provided to the process chamber and the first reactive gas may be dosed or pulsed into the process chamber followed by a dose or pulse of the second reactive gas into the process chamber. In such embodiments, a delay or pause may occur between the dose of the first reactive gas and the second reactive gas, allowing the continuous flow of inert gas to purge the process chamber between doses of the process gases.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

As used in this specification and the appended claims, the terms "precursor", "reactant", "reactive gas" and the like are used interchangeably to refer to any gaseous species that can react with the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the titanium nitride film at 420 may begin by exposing the substrate to a first reactive gas. The first reactive gas comprises a titanium precursor and is exposed to the substrate for a first period of time, as shown at 430. In some embodiments, the titanium precursor is supplied without the use of a plasma.

The titanium precursor may be any suitable compound to adsorb a layer of titanium atoms on the substrate surface for later reaction. In some embodiments, the titanium precursor comprises or consists essentially of titanium tetrachloride ($TiCl_4$). As used in this regard, a reactant which consists essentially of a stated species comprises greater than 95%, 98%, 99% or 99.5% of the stated species on a molar basis, excluding any inert diluent gases.

The period of time that the substrate is exposed to the titanium precursor may be any suitable amount of time necessary to allow the titanium precursor to form an adequate adsorption layer atop the substrate surface. For example, the process gas may be flowed into the process chamber for a period of about 0.1 seconds to about 90 seconds. In some time-domain ALD processes, the titanium precursor is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the titanium precursor. The inert gas may be mixed with the titanium precursor (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

Additional process parameters may also be regulated while exposing the substrate to the titanium precursor. Some process parameters (e.g., substrate temperature, chamber pressure) may be maintained relatively constant throughout the method 400

In some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr. In some embodiments, the process chamber is maintained at a pressure of less than or equal to 50 Torr, less than or equal to 25 Torr, less than or equal to about 10 Torr, less than or equal to about 5 Torr, or less than or equal to about 1 Torr.

In some embodiments, the temperature of a substrate during processing may be maintained at a temperature in a range of 300° C. to 650° C. or in a range of 400° C. to 500° C. In some embodiments, the substrate is maintained at a temperature less than 650° C., less than 600° C., less than 550° C. or less than 500° C.

Next, at 435, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the titanium precursor at 430. In embodiments where the inert gas is the same, the purge may be performed by diverting the first reactive gas from the process chamber, allowing the inert gas to flow through the process chamber, purging the process chamber of any excess first reactive gas components or reaction byproducts. In some embodiments, the inert gas may be provided at the same flow rate used in conjunction with the first reactive gas, described above, or in some embodiments, the flow rate may be increased or decreased. For example, in some embodiments, the inert gas may be provided to the process chamber at a flow rate of about 0 to about 10000 sccm to purge the process chamber.

In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first reactive gas components and/or excess reaction byproducts from the process chamber to prevent unwanted gas phase reactions of the first and second reactive gases.

Next, at 440, the substrate is optionally exposed to a second reactive gas for a second period of time. The second reactive gas comprises a nitrogen precursor. In some embodiments, the nitrogen precursor reacts with the adsorbed layer of titanium precursor on the substrate surface to deposit a titanium nitride film.

The nitrogen precursor may be any suitable precursor to react with the adsorbed titanium layer on the substrate. In some embodiments, the nitrogen precursor comprises or consists essentially of ammonia. In some embodiments, the nitrogen precursor is supplied without the use of a plasma.

The period of time that the substrate is exposed to the nitrogen precursor may be any suitable amount of time necessary to allow for the nitrogen precursor to react with the substrate surface or materials thereon. For example, the process gas may be flowed into the process chamber for a period of about 0.1 seconds to about 90 seconds. In some time-domain ALD processes, the nitrogen precursor is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the nitrogen precursor. The inert gas may be mixed with the nitrogen precursor (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

Next, at 445, the process chamber may be purged using an inert gas. The purge step at 445 is similar to the purge step described above at 435.

Next at 450, the substrate is exposed to a direct microwave plasma generated from a plasma gas. In some embodiments, the plasma gas is flowed into the processing chamber and then ignited to form the direct plasma. In some embodiments, the plasma is ignited with one or more microwave sources comprising an applicator with a dielectric resonant cavity. An exemplary microwave source is described above.

Without being bound by theory, it is believed that the microwave sources described and utilized herein are capable of generating plasma within close proximity to the substrate surface. In some embodiments, the direct microwave plasma is generated within 25 mm, 20 mm 15 mm, 10 mm, or 5 mm of the substrate surface. In some embodiments, the distance between the open end of the applicator housing 355 and the substrate surface is less than or equal to 100 mm, less than or equal to 80 mm, less than or equal to 60 mm, or less than or equal to 50 mm.

The microwave sources described herein are able to generate a plasma with a higher plasma density and/or a lower ion energy than other plasma sources. For example, the microwave modules may allow for a power density that is approximately five or more times greater than typical RF plasma processing systems. For example, typical power into a plasma enhanced chemical vapor deposition process is approximately 3,000 W, and provides a power density of approximately 4 W/cm$^2$ for a 300 mm diameter wafer. In contrast, the microwave modules according to some embodiments may use a 300 W power amplifier with a 4 cm diameter applicator, to provide a power density of approximately 24 W/cm$^2$.

In some embodiments, the direct plasma has a power in a range of 250 W to 5000 W, in a range of 400 W to 4000 W, or in a range of about 500 W to 3000 W. In some embodiments, the direct plasma has a power of greater than or equal to 400 W, greater than or equal to 500 W or greater than or equal to 600 W.

Without being bound by theory, in some embodiments, the direct plasma reacts with the titanium precursor to form the titanium nitride film. In some embodiments, the direct plasma reacts with the titanium precursor (supplied at 430) and the nitrogen precursor (supplied at 440 and/or 460) to form the titanium nitride film. In some embodiments, the direct plasma contains N* and/or NH* radicals which react with the titanium precursor (supplied at 430) to form the titanium nitride film. In some embodiments, the direct plasma reacts with a titanium nitride film formed by the reaction of the titanium precursor (supplied at 430) and the nitrogen precursor (supplied at 440 and/or 460) to reduce impurity levels, resistivity and film stress.

The plasma gas comprises one or more of hydrogen gas ($H_2$), argon, ammonia or nitrogen gas ($N_2$). In some embodiments, the plasma gas further comprises one or more of argon or hydrogen gas ($H_2$). In some embodiments, the plasma gas comprises argon and at least one of nitrogen gas ($N_2$), hydrogen gas ($H_2$) or ammonia. In some embodiments, the plasma gas comprises hydrogen gas ($H_2$), nitrogen gas ($N_2$) and at least one of argon or ammonia.

In some embodiments, at 450, the substrate is exposed to a plurality of direct plasmas. In some embodiments, a first direct plasma is formed from a first plasma gas while a second direct plasma is formed from a second plasma gas. In some embodiments, the first direct plasma comprises N* radicals without NH* radicals. In some embodiments, both the first direct plasma and the second direct plasma comprise N* and NH* radicals. In some embodiments, the first plasma gas and the second plasma gas comprise one or more of hydrogen gas ($H_2$), argon, ammonia or nitrogen gas ($N_2$). In some embodiments, the first plasma gas comprises or consists essentially of nitrogen gas ($N_2$) and argon. In some embodiments, the first plasma gas and/or the second plasma gas consists essentially of argon and ammonia or argon, nitrogen gas ($N_2$) and hydrogen gas ($H_2$). In some embodiments, the first plasma gas and/or the second plasma gas comprises or consists essentially of argon, ammonia, nitrogen gas ($N_2$) and hydrogen gas ($H_2$).

Next, at 455, the process chamber may be purged using an inert gas. The purge step at 455 is similar to the purge step described above at 435.

Next, at 460, the substrate is optionally exposed to a third process gas for a third period of time. The third process gas comprises a nitrogen precursor. The nitrogen precursor utilized in the third process gas may be the same or different than the nitrogen precursor utilized in the second reactive gas. If the nitrogen precursor utilized in the second reactive gas and the third process gas are the same, the different processing steps may be described as a first pulse of nitrogen precursor and a second pulse of nitrogen precursor.

Without being bound by theory, in some embodiments, the nitrogen precursor reacts with any remaining adsorbed layer of titanium precursor on the substrate surface to deposit a titanium nitride film. In some embodiments, the nitrogen precursor may adsorb onto the substrate surface for possible reaction in subsequent process cycles.

In some embodiments, the nitrogen precursor of the third process gas comprises or consists essentially of ammonia. In some embodiments, the nitrogen precursor is supplied without the use of a plasma.

Next, at 465, the process chamber may be purged using an inert gas. The purge step at 465 is similar to the purge step described above at 435.

While the generic embodiment of the processing method shown in FIG. 3 includes two, three or four pulses of reactive gases, it will be understood that this is merely exemplary and that additional pulses of reactive gases may be used. The sub processes of 420 comprise a cycle. A cycle may be performed in any order as long as the reactive gases are separated by a purge of the processing chamber.

Next, at 470, it is determined whether the titanium nitride film has achieved a predetermined thickness. If the predetermined thickness has not been achieved, the method 400 returns to 420 to continue forming the titanium nitride film until the predetermined thickness is reached. Once the predetermined thickness has been reached, the method 400 can either end or proceed to 480 for optional further processing (e.g., bulk deposition of a metal film).

The titanium nitride films deposited are superior to titanium nitride films deposited by other plasma processes and/or thermal processes. In some embodiments, the titanium nitride films of this disclosure have a predetermined titanium:nitrogen (Ti:N) ratio. In some embodiments, the predetermined Ti:N ratio is greater than or equal to about 1. In some embodiments, the predetermined ratio is less than or equal to about 1.

In some embodiments, the titanium nitride films of this disclosure have a lower chlorine (Cl$^-$) content. In some embodiments, the titanium nitride films of this disclosure have a lower film stress. In some embodiments, the titanium nitride films of this disclosure have lower resistivity.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing titanium nitride, the method comprising sequentially exposing a substrate surface to a titanium precursor and a direct microwave plasma generated from a plasma gas by one or more microwave sources comprising an applicator with a dielectric resonant cavity, wherein the direct microwave plasma is generated within 20 nm of the substrate surface.

2. The method of claim 1, wherein a distance between the one or more microwave sources and the substrate surface is less than or equal to 50 mm.

3. The method of claim 1, wherein the plasma gas comprises ammonia or nitrogen gas ($N_2$).

4. The method of claim 2, wherein the plasma gas further comprises one or more of argon or hydrogen.

5. The method of claim 1, wherein the microwave plasma power delivered to plasmas gas is greater than or equal to 500 W.

6. The method of claim 1, wherein the substrate surface is maintained at a temperature of less than or equal to 600° C.

7. A method of depositing titanium nitride, the method comprising sequentially exposing a substrate surface to a titanium precursor, ammonia gas, and a direct microwave plasma generated from a plasma gas by one or more microwave sources comprising an applicator with a dielectric resonant cavity by one or more microwave sources comprising an applicator with a dielectric resonant cavity, wherein the direct microwave plasma is generated within 20 nm of the substrate surface.

8. The method of claim 7, wherein the plasma gas comprises argon.

9. The method of claim 8, wherein the plasma gas further comprises hydrogen gas ($H_2$), ammonia or nitrogen gas ($N_2$).

10. The method of claim 7, wherein the plasma gas comprises hydrogen gas ($H_2$), and nitrogen gas ($N_2$).

11. The method of claim 10, wherein the plasma gas further comprises at least one of argon or ammonia.

12. A method of depositing titanium nitride, the method comprising sequentially exposing a substrate surface to a titanium precursor, a first direct plasma generated from a first plasma gas, and a second direct microwave plasma generated from a second plasma gas by one or more microwave sources comprising an applicator with a dielectric resonant cavity, wherein the direct microwave plasma is generated within 20 nm of the substrate surface.

13. The method of claim 12, wherein the first plasma gas consists essentially of nitrogen gas ($N_2$).

14. The method of claim 12, wherein the first plasma gas consists essentially of nitrogen gas and argon.

15. The method of claim 12, wherein the second plasma gas consists essentially of ammonia and argon.

16. The method of claim 12, wherein the second plasma gas consists essentially of nitrogen gas, hydrogen gas and argon.

17. The method of claim 12, wherein the second plasma gas consists essentially of nitrogen gas, hydrogen gas, ammonia and argon.

* * * * *